United States Patent
Sanghani et al.

(10) Patent No.: US 9,500,706 B2
(45) Date of Patent: Nov. 22, 2016

(54) HYBRID ON-CHIP CLOCK CONTROLLER TECHNIQUES FOR FACILITATING AT-SPEED SCAN TESTING AND SCAN ARCHITECTURE SUPPORT

(71) Applicant: NVIDIA Corporation, Santa Clara, CA (US)

(72) Inventors: Amit Sanghani, San Jose, CA (US); Sagar Nataraj, Sunnyvale, CA (US); Karthikeyan Natarajan, Fremont, CA (US); Bo Yang, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 309 days.

(21) Appl. No.: 14/161,348

(22) Filed: Jan. 22, 2014

(65) Prior Publication Data

US 2015/0204945 A1   Jul. 23, 2015

(51) Int. Cl.
*G01R 31/3185* (2006.01)
*G01R 31/40* (2014.01)

(52) U.S. Cl.
CPC ......... *G01R 31/318594* (2013.01); *G01R 31/318522* (2013.01)

(58) Field of Classification Search
CPC ............. G01R 31/318594; G01R 31/318552; G01R 31/318536; G01R 31/318541; G01R 31/318555; G01R 31/318572; G01R 31/31701

See application file for complete search history.

(56) References Cited

U.S. PATENT DOCUMENTS

| | | | |
|---|---|---|---|
| 7,305,598 B1 | 12/2007 | Sanghani et al. | |
| 7,919,981 B2 | 4/2011 | Irie | |
| 2004/0085082 A1* | 5/2004 | Townley | G01R 31/31922 324/762.01 |
| 2005/0240790 A1* | 10/2005 | Nadeau-Dostie | G01R 31/31858 713/400 |
| 2007/0288818 A1* | 12/2007 | Wang | G01R 31/31858 714/726 |
| 2008/0004831 A1 | 1/2008 | Li | |
| 2008/0115005 A1 | 5/2008 | Kamada | |
| 2012/0062266 A1 | 3/2012 | Gorti et al. | |
| 2012/0173943 A1 | 7/2012 | Cesari | |
| 2012/0331362 A1 | 12/2012 | Tekumalla | |

* cited by examiner

*Primary Examiner* — Cynthia Britt
*Assistant Examiner* — Dipakkumar Gandhi
(74) *Attorney, Agent, or Firm* — Zilka-Kotab, PC

(57) ABSTRACT

Various aspects described or referenced herein are directed to different methods, systems, and computer program products for implementing hybrid on-chip clock controller techniques for facilitating at-speed scan testing and scan architecture support.

20 Claims, 8 Drawing Sheets

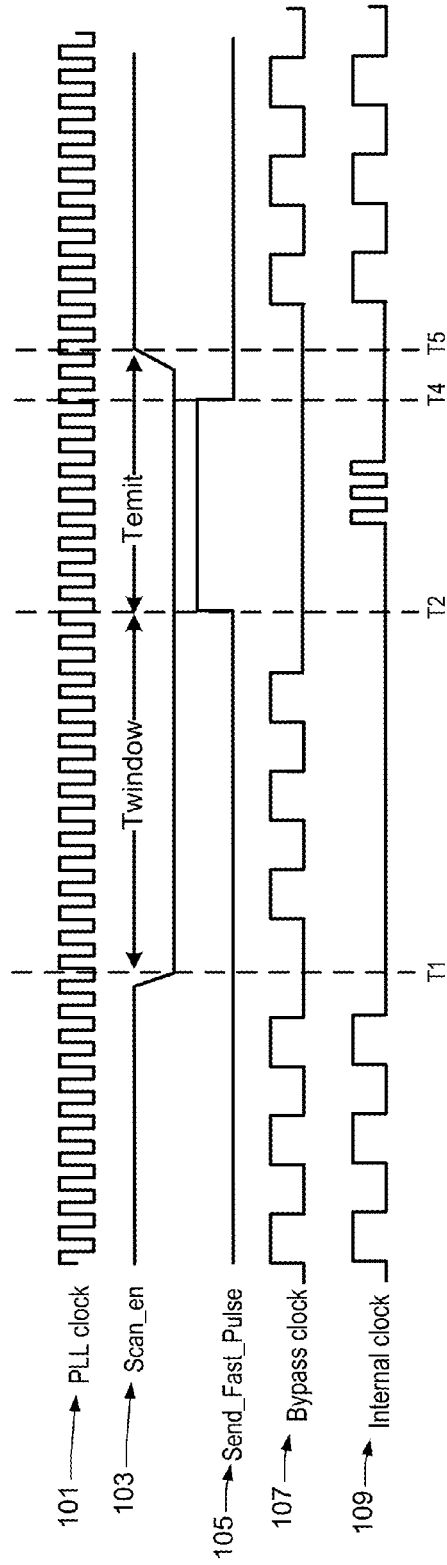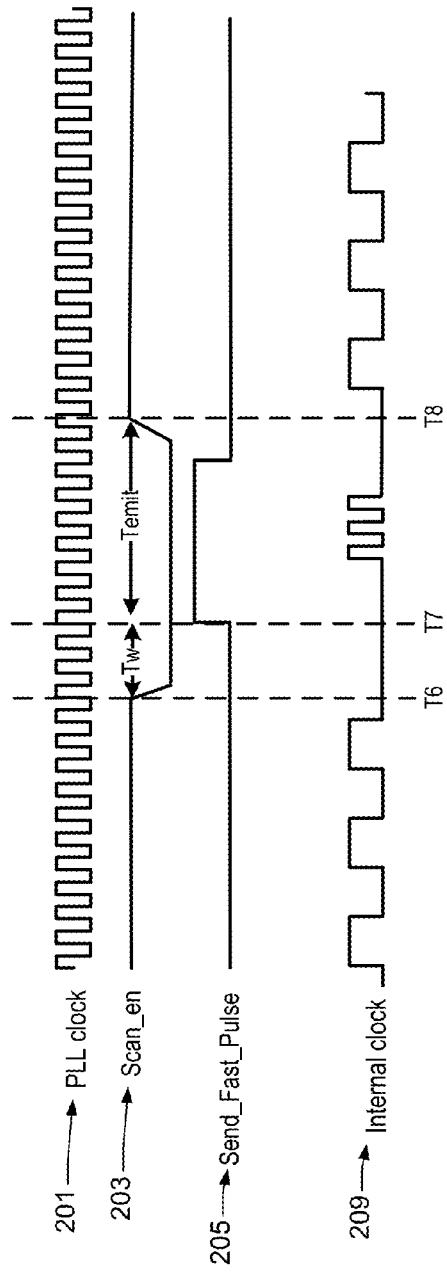

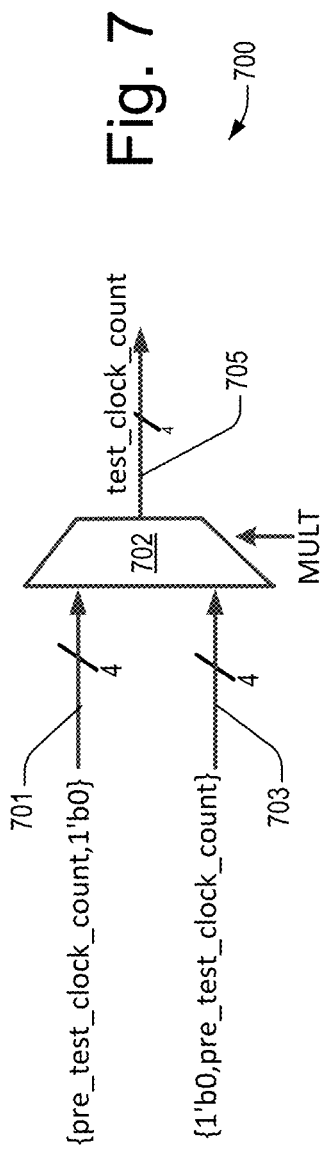
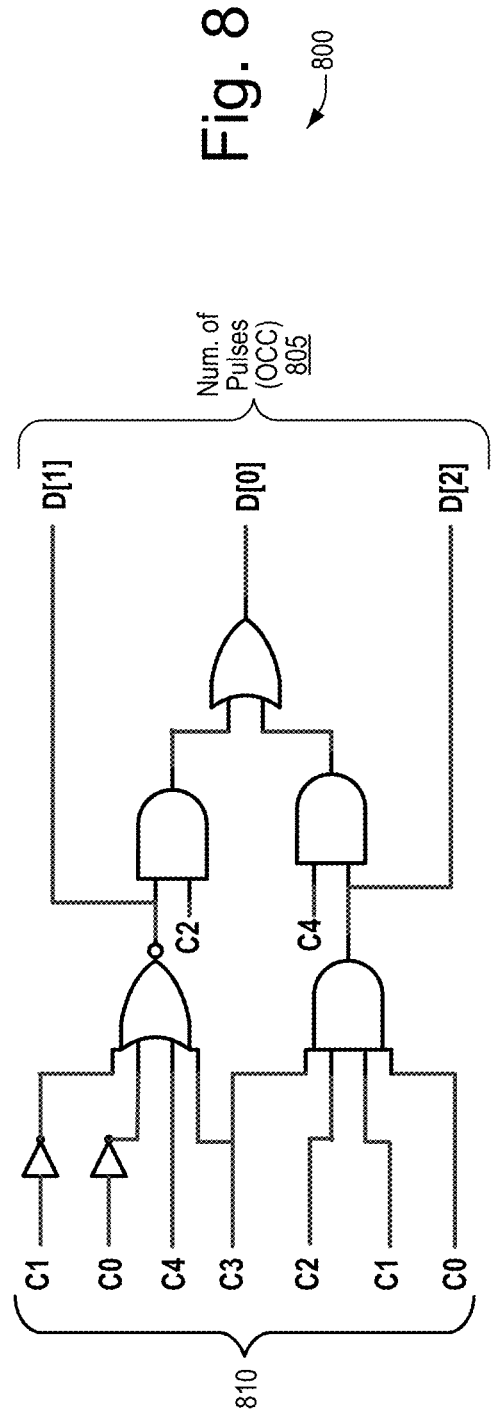

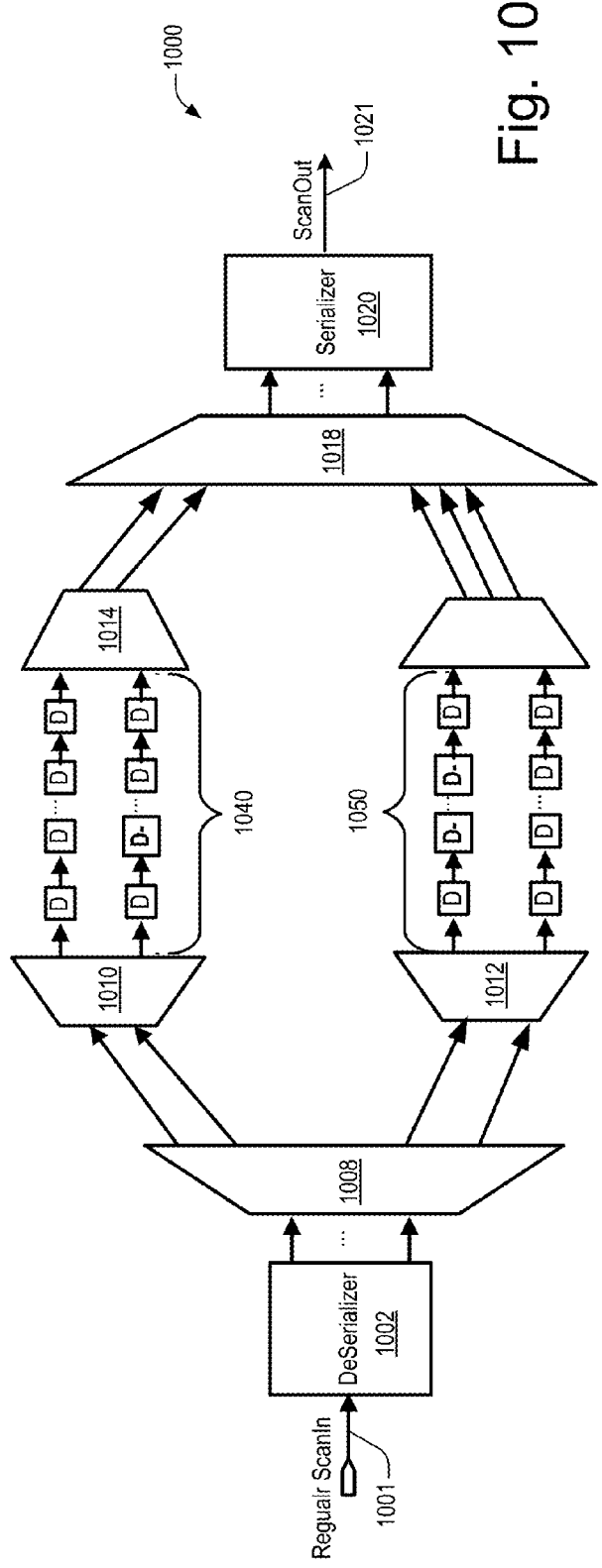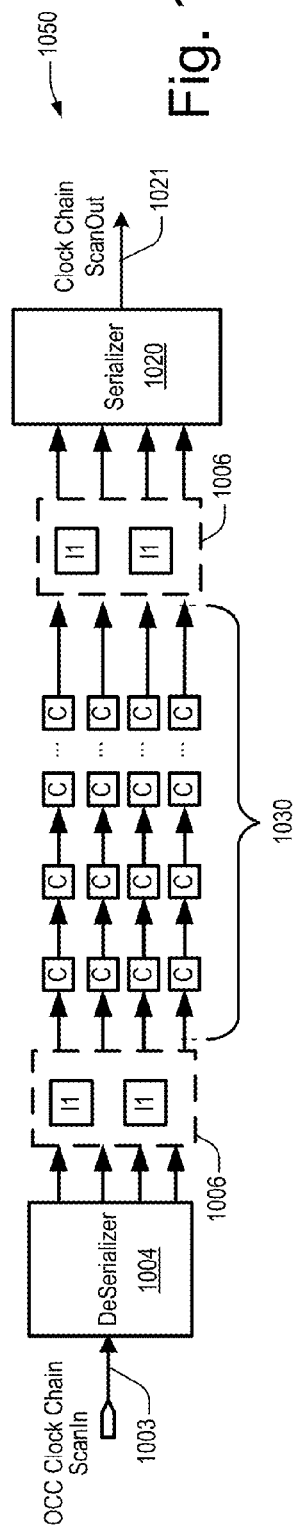

HYBRID ON-CHIP CLOCK CONTROLLER TECHNIQUES FOR FACILITATING AT-SPEED SCAN TESTING AND SCAN ARCHITECTURE SUPPORT

BACKGROUND

The present disclosure relates to integrated circuit (IC) chip testing. More particularly, the present disclosure relates to on-chip clock controller techniques for facilitating at-speed scan testing and scan architecture support.

Semiconductor integrated circuits are tested after the manufacture to detect malfunctions of the circuits, such as delay faults, stuck-at faults, and transition faults. One known integrated circuit design technique for improving testability is to incorporate test circuits into the circuits to be designed. Such design technique is often referred to as Design-for-Testability (DFT). A popular DFT scheme for integrated circuit (IC) manufacture testing is the scan-based technique. For example, a common method for delivering test data from chip inputs to internal circuits under test (CUTs), and observing their outputs, is called scan-design. In scan-design, registers (flip-flops or latches) in the design are connected in one or more scan chains, which are used to gain access to internal nodes of the chip. Traditionally, the scan chains are comprised of chains of flip-flops (also referred to as "scan flops") that are used to form serial shift registers for applying input test patterns to combinational logic of the integrated circuit and for reading out the corresponding results. Test patterns are shifted in via the scan chain(s), functional clock signals are pulsed to test the circuit during the "capture cycle(s)", and the results are then shifted out to chip output pins and compared against expected results. For example, in a typical DFT scan operation, test stimuli are shifted (at relatively slow clock speeds) from an Automatic Test Equipment (ATE) device test channel into the scan chains. Capture clock pulses are then applied on scan flops during capture, and the captured results are then shifted out for analysis.

However, as integrated circuits have become increasingly faster, smaller, and more complex, the spectrum of IC chip defects has grown to include more problems such as high impedance shorts, in-line resistance, and crosstalk between signals, which are not always detected with the traditional static-based tests, known as stuck-at tests. Accordingly, in order to maintain quality levels, it is becoming increasingly necessary to subject ICs to a variety of additional tests that test for different types of faults. As a result, the total amount time required to complete thorough testing of ICs has grown increasing longer.

BRIEF DESCRIPTION OF THE DRAWINGS

FIG. 1 shows an example timing diagram illustrating one embodiment for implementing at-speed scan testing.

FIG. 2 shows an example timing diagram illustrating one embodiment for implementing at-speed scan test patterns using the OCC Clock Chain engine.

FIG. 7 shows an example embodiment of a Test Clock Count Multiplier 700.

FIG. 8 shows a logic diagram of an OCC Clock Chain Decoder architecture 800 in accordance with a specific embodiment.

FIGS. 9-11 illustrate various example embodiments of different types of test compression schemes which may be used for DFT testing.

DETAILED DESCRIPTION OF EXAMPLE EMBODIMENTS

Overview

Figure 3:
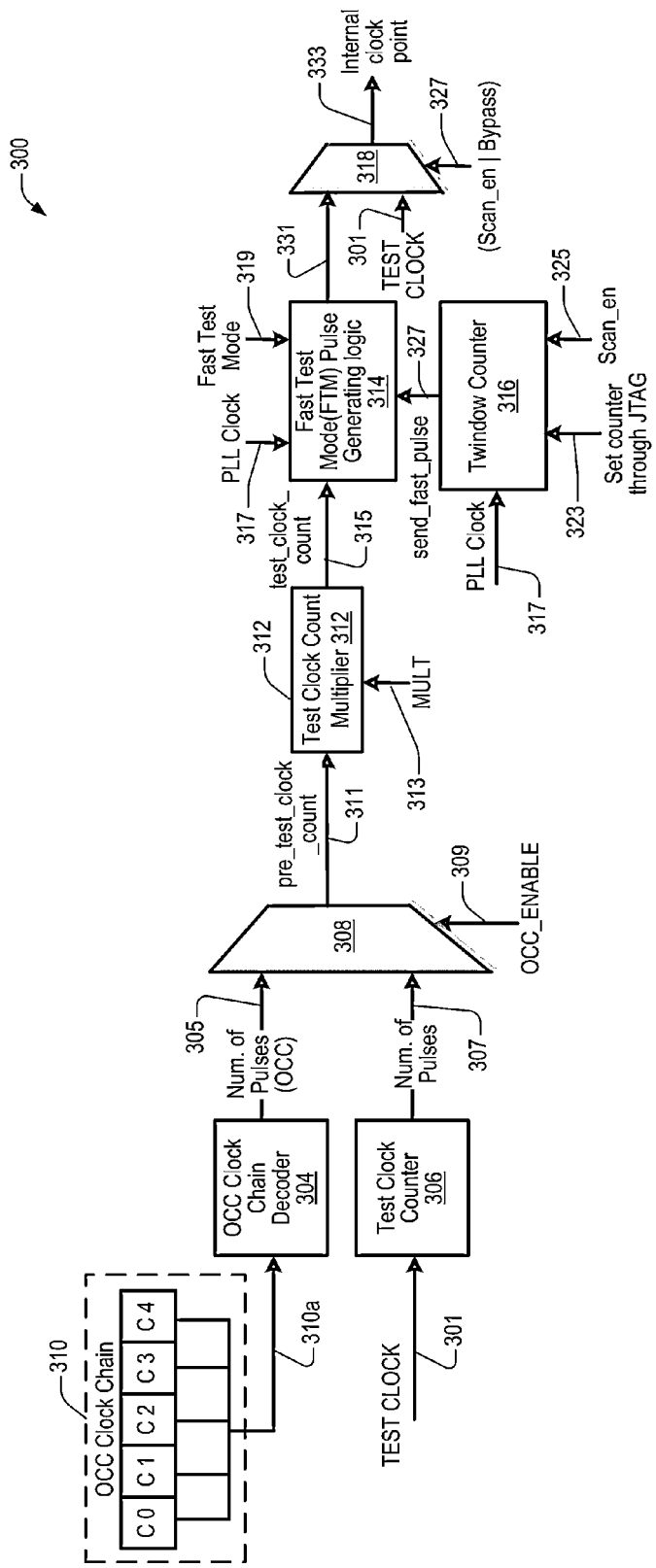
FIG. 3 shows an embodiment of a hybrid on-chip clock controller architecture 300 which may be used for implementing various scan testing techniques disclosed herein.

Various aspects described or referenced herein are directed to different methods, systems, and computer program products for implementing hybrid on-chip clock controller techniques for facilitating at-speed scan testing and scan architecture support.

One aspect disclosed herein is directed to different methods, systems, and computer program products for: receiving, at a semiconductor device to be tested, an external test clock signal, wherein the external test clock signal includes a first set of external test clock pulses; determining, using the external test clock signal, a first pulse count value representing the first set of external test clock pulses; causing the semiconductor device to generate a first set of higher frequency test clock signals for a first configurable number of clock cycles during a first capture period, wherein the first configurable number of clock cycles corresponds to the first pulse count value; generating at the semiconductor device an OCC Clock Chain signal, the OCC Clock Chain signal including a first set of OCC Clock Chain data represented by a first set of bits; determining, using the OCC Clock Chain signal, an OCC pulse count value representing a specific number of higher frequency test clock signal(s) to be generated at the semiconductor device during a second capture period; and; causing the semiconductor device to generate a second set of higher frequency test clock signals for a second configurable number of clock cycles during the second capture period, wherein the second configurable number of clock cycles corresponds to the OCC pulse count value.

Another aspect disclosed herein is directed to different methods, systems, and computer program products for: causing a semiconductor device to dynamically switch to a test clock pulse control mode of operation during a first time interval; performing a first plurality of operations at the semiconductor device during the test clock pulse control mode of operation, the first plurality of operations including: (i) receiving a test clock signal, wherein the test clock signal includes a first set of test clock pulses; (ii) determining, using the test clock signal, a first pulse count value representing the first set of test clock pulses; (iii) generating a first set of higher frequency test clock signals for a first configurable number of clock cycles during a first capture period, wherein the first configurable number of clock cycles corresponds to the first pulse count value; causing the semiconductor device to dynamically switch to an OCC clock chain control mode of operation during a second time interval; and performing a second plurality of operations at the semiconductor device during the OCC clock chain control mode of operation, the second plurality of operations including: (i) generating an OCC Clock Chain signal, the OCC Clock Chain signal including a first set of OCC Clock Chain data represented by a first set of bits; (ii) determining, using the OCC Clock Chain signal, an OCC pulse count value representing a specific number of higher frequency test clock signal(s) to be generated at the semiconductor device during a second capture period; (iii) generating a second set of higher frequency test clock signals for a second configurable number of clock cycles during the second capture period, wherein the second configurable number of clock cycles corresponds to the OCC pulse count value.

Another aspect disclosed herein is directed to semiconductor device, comprising: a clock generator; an external test clock input configured or designed to receive an external test clock signal, wherein the external test clock signal includes a first set of external test clock pulses; an external test clock counter coupled to the external test clock input, the external test clock counter being configured or designed to determine, using the external test clock signal, a first pulse count value representing the first set of external test clock pulses; an OCC Clock Chain engine configured or designed to generate an OCC Clock Chain signal, the OCC Clock Chain signal including a first set of OCC Clock Chain data represented by a first set of bits; an OCC Clock Chain decoder configured or designed to determine, using the OCC Clock Chain signal, an OCC pulse count value representing a specific number of higher frequency test clock signal(s) to be generated at the semiconductor device during a second capture period; and fast test mode pulse generating logic coupled to the clock generator, the fast test mode pulse generating logic being configured or designed to cause the clock generator to generate a first set of higher frequency test clock signals for a first configurable number of clock cycles during a first capture period, wherein the first configurable number of clock cycles corresponds to the first pulse count value; the fast test mode pulse generating logic being further configured or designed to cause the clock generator to generate a second set of higher frequency test clock signals for a second configurable number of clock cycles during the second capture period, wherein the second configurable number of clock cycles corresponds to the OCC pulse count value.

Another aspect disclosed herein is directed an apparatus comprising: a clock generator coupled to a clock input signal; and a test clock generator configured or designed to receive a clock signal generated by the clock generator, the test clock generator being further configured or designed to generate a first set of higher frequency test clock signals derived at least in part from the clock signal generated by the clock generator, the test clock generator being further configured or designed to generate the first set of higher frequency test clock signal for a first configurable number of clock periods; an OCC Clock Chain engine configured or designed to generate an OCC Clock Chain signal, the OCC Clock Chain signal including a first set of OCC Clock Chain data represented by a first set of bits; an OCC Clock Chain decoder configured or designed to determine, using the OCC Clock Chain signal, an OCC pulse count value representing a specific number of higher frequency test clock signal(s) to be generated at the semiconductor device during a second capture period; fast test mode pulse generating logic coupled to the test clock generator, the fast test mode pulse generating logic being configured or designed to cause the test clock generator to generate a second set of higher frequency test clock signals for a second configurable number of clock cycles during the second capture period, wherein the second configurable number of clock cycles corresponds to the OCC pulse count value.

Various additional objects, features and advantages of the various aspects described or referenced herein will become apparent from the following descriptions of its example embodiments, which descriptions should be taken in conjunction with the accompanying drawings.

Specific Example Embodiments

Various techniques will now be described in detail with reference to a few example embodiments thereof as illustrated in the accompanying drawings. In the following description, numerous specific details are set forth in order to provide a thorough understanding of one or more aspects and/or features described or reference herein. It will be apparent, however, to one skilled in the art, that one or more aspects and/or features described or reference herein may be practiced without some or all of these specific details. In other instances, well known process steps and/or structures have not been described in detail in order to not obscure some of the aspects and/or features described or reference herein.

One or more different inventions may be described in the present application. Further, for one or more of the invention(s) described herein, numerous embodiments may be described in this patent application, and are presented for illustrative purposes only. The described embodiments are not intended to be limiting in any sense. One or more of the invention(s) may be widely applicable to numerous embodiments, as is readily apparent from the disclosure. These embodiments are described in sufficient detail to enable those skilled in the art to practice one or more of the invention(s), and it is to be understood that other embodiments may be utilized and that structural, logical, software, electrical and other changes may be made without departing from the scope of the one or more of the invention(s). Accordingly, those skilled in the art will recognize that the one or more of the invention(s) may be practiced with various modifications and alterations. Particular features of one or more of the invention(s) may be described with reference to one or more particular embodiments or figures that form a part of the present disclosure, and in which are shown, by way of illustration, specific embodiments of one or more of the invention(s). It should be understood, however, that such features are not limited to usage in the one or more particular embodiments or figures with reference to which they are described. The present disclosure is neither a literal description of all embodiments of one or more of the invention(s) nor a listing of features of one or more of the invention(s) that must be present in all embodiments.

Headings of sections provided in this patent application and the title of this patent application are for convenience only, and are not to be taken as limiting the disclosure in any way. Additionally, devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. To the contrary, a variety of optional components are described to illustrate the wide variety of possible embodiments of one or more of the invention(s).

Further, although process steps, method steps, algorithms or the like may be described in a sequential order, such processes, methods and algorithms may be configured to work in alternate orders. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the invention(s), and does not imply that the illustrated process is preferred.

When a single device or article is described, it will be readily apparent that more than one device/article (whether or not they cooperate) may be used in place of a single device/article. Similarly, where more than one device or article is described (whether or not they cooperate), it will be readily apparent that a single device/article may be used in place of the more than one device or article.

The functionality and/or the features of a device may be alternatively embodied by one or more other devices that are not explicitly described as having such functionality/features. Thus, other embodiments of one or more of the invention(s) need not include the device itself. Techniques and mechanisms described or reference herein will sometimes be described in singular form for clarity. However, it should be noted that particular embodiments include multiple iterations of a technique or multiple instantiations of a mechanism unless noted otherwise.

The present disclosure describes various types of on-chip clock controller techniques for facilitating defect testing of ICs. As described in greater detail herein, one such technique relates to a hybrid on-chip clock controller for facilitating stuck-at testing and at-speed testing of ICs.

Today's deep sub-micron technology, with its ever reducing feature sizes, reducing voltage levels, and increasing speed is resulting in the ICs failing with new failure mechanisms. This is due to the fact that the increasing integration levels and speed of operation of the ICs are resulting in new kind of defects. In addition, these factors also make the ICs more susceptible to defects that may previously have been benign. Thus, in order to maintain and/or improve the quality levels, it is becoming increasingly necessary to subject ICs to a variety of tests that test for different types of faults, such as the conventional stuck-at faults and delay faults.

In the conventional scan-based stuck-at fault testing, test patterns are applied to the IC at a much slower speed than the IC's functional speed. The application of a typical scan based stuck-at test pattern involves several steps. For example, initially the IC may be placed in the scan or shift mode and the test pattern may be shifted in from an external automated test equipment (ATE). The IC may then be placed in the capture mode, and the response is captured. Thereafter, the IC may be placed back in the shift mode, and the response is shifted out.

In order to reduce test application time, the scanning out of the IC's response for a test pattern may be merged with the scanning in of the subsequent test pattern. This sequence of events is usually coordinated by an external ATE, which typically supplies all the clocks in the shift as well as the capture mode.

For at-speed scan testing (also referred to as transition testing), the capture pulses applied during capture should preferably operate at actual functional operating frequency to ensure the transition fault detection. Typically, however, the relative slow clock speeds of the ATE (e.g., which is typically in the MHz range) cannot provide the capture clock pulses that match functional clock frequency (e.g., which is typically in the GHz range). Additionally, it is preferable that the ATE supply clocks of the same frequency as the IC's functional clocks, which is often difficult to satisfy.

FIG. 1 shows an example timing diagram illustrating one embodiment for implementing at-speed scan testing. In the specific example embodiment of FIG. 1, on-chip clock (OCC) engines (which, for example, may be clocked by PLL clocks) count the number of test clock pulses (e.g., pulses from Bypass clock 107) during a time interval herein referred to as Twindow (e.g., time interval T1-T2 of FIG. 1). Thereafter, the OCC engines issue the same number of internal fast clocks (as indicated by internal clock 109) during a Temit time interval (e.g., time interval T2-T4). In at least one embodiment, the start of the Temit window commences upon issuing of a Send_Fast_Pulse signal 105, as illustrated in FIG. 1 at T2.

One issue which may preferably be taken into consideration with regard to the embodiment of FIG. 1 is that, when performing at-speed scan test patterns using ATE, a sufficient number of wait cycles should preferably be added in capture mode (e.g., during Twindow) to ensure that the OCC engine is able to sample the test clock pulses (e.g., during Twindow), and then issue internal fast clock pulses (e.g., during Temit). This results in a significant increase in the total capture period, which, for example, may be defined to include both the Twindow time interval and the Temit time interval. In at least one embodiment, the determination of the number of wait cycles may be a function of: the Joint Test Action Group (JTAG) flops that are initialized during test setup, shift clock speed, functional PLL clock speed, and/or other criteria. Such dependencies give rise to various types of issues such as, for example, one or more of the following (or combinations thereof):

Delay ATPG (Automatic Test Pattern Generation) Verification. For example, in at least some cases, it is possible that the functional clock POR (Point Of Record) might change during verification. Accordingly, to accommodate this possibility, it is preferable to insert a very conservative long dummy cycle (e.g., several hundred cycles) covering all the clock domains. Additionally, when performing testing using multiple clock domains on a single chip, it is also preferable to select the slowest clock domain for use across all domains.

Delay ATE Bring Up. For example, at the early stage of bring up, the input test pattern (e.g., from the ATE) might only be running at about 5 MHz shift speed; whereas, during the final production stage, the shift speed may reach or exceed about 200 MHz. These differences in shift speeds at different stages of the test cycle often necessitate distinctly different JTAG programming to be used for each different stage), and also may require that the worst case wait cycle be used at each stage. Accordingly, in such situations, it is desirable to select a wait cycle window which can cover a wide range of clock signals, thereby causing increased test time.

Test Time Cost: As the slowest functional clock is only a few hundred MHz, lots of wait cycles need to be added to make Twindow big enough to ensure that the OCC engine is able to sample the test clock pulses during Twindow. On Kepler chips, for example, the average wait cycle (or padding cycle) per pattern is about 400 cycles, which is corresponds to about 37% extra test time of transition patterns due to the insertion of the additional wait cycles for each test pattern. One solution for overcoming at least some of the issues relating to at-speed scan testing is to utilize On-chip Clock Controllers (OCC) to generate internal fast pulses from an on-chip Phase-Locked Loop (PLL), as illustrated in the example embodiment of FIG. 3.

FIG. 3 shows an embodiment of a hybrid on-chip clock controller architecture 300 which may be used for implementing various scan testing techniques disclosed herein. As illustrated in the example embodiment of FIG. 3, and as described in greater detail herein, the hybrid on-chip clock controller architecture may be been designed with minimal hardware, overhead, and timing impact. In at least one embodiment, the hybrid on-chip clock controller 300 may be configured or designed to support both OCC clock chain control mode (e.g., utilizing OCC Clock Chain input 310a) and test clock pulse control mode (e.g., utilizing Test Clock input 301). Thus, for example, in at least one embodiment of the hybrid on-chip clock controller, the at-speed capture pulses can be controlled by clock chains (e.g., via OCC Clock Chain flops 310) and/or Test Clock pulses (which, for example, may be provided via external test clock input), thereby allowing the hybrid on-chip clock controller to be fully compatible with a wide variety of at-speed testing schemes.

As illustrated in the example embodiment of FIG. 3, the hybrid on-chip clock controller 300 may include, but is not limited to, one or more of the following types of components (or combinations thereof):

OCC Clock Chain Engine 310, which, for example, may be configured or designed to generate and output different types of OCC-based test patterns. An example embodiment of a 5 bit OCC Clock Chain engine is depicted in FIG. 3, and is further illustrated and described with respect to FIG. 5. In at least one embodiment, each bit of the OCC chain (e.g., C0-C4) may represent a distinct pulse of the clock (e.g., PLL Clock). For example, an OCC Clock Chain output (310a) of 00001 may be interpreted to mean 1 pulse on the clock, an OCC Clock Chain output of 00011 may be interpreted to mean 2 pulses on the clock, an OCC Clock Chain output of 00111 may be interpreted to mean 3 pulses, and so on.

OCC Clock Chain Decoder 304, which, for example, may be configured or designed to count and/or determine the number of pulses associated with OCC Clock Chain output 310a. An example embodiment of an OCC Clock Chain Decoder architecture is illustrated and described with respect to FIG. 8. In at least one embodiment, the OCC Clock Chain Decoder processes decodes the value(s) of the OCC Clock Chain output 310a in order to determine the number of pulses (e.g., 0, 1, 2, 3, . . . , etc.) to be applied to the PLL Clock. In at least some embodiments, the OCC Clock Chain Decoder may be configured or designed to discard invalid values in the OCC Clock Chain signal(s). For example, in one embodiment, invalid values may include 0's in between 1's. By way of illustration, the example table below is intended to help illustrate the at least a portion of the functionality of the OCC Clock Chain Decoder.

| OCC Clock Chain Output (310a) | OCC Clock Chain Decoder Output (305) |
|---|---|
| 00001 | 1 (pulse) |
| 00011 | 2 (pulses) |
| 00111 | 3 (pulses) |
| 01111 | 4 (pulses) |

In at least one embodiment, the OCC Clock Chain Decoder may be configured or designed to treat as invalid any OCC Clock Chain Output which includes one or more 0's in between the 1's (such as, for example, 01010, 00101, 11011, etc.).

Test Clock Counter 306. An example embodiment of a Test Clock Counter architecture is illustrated and described with respect to FIG. 6. In at least one embodiment, the Test Clock Counter may be configured or designed to receive Test Clock signals from external (e.g., off-chip) sources such as ATE. The Test Clock Counter may also be configured or designed to count the number of test clock pulses that are applied on the ATE (e.g., via Test Clock input 301) within a specified time interval, determine the number of PLL pulse(s) to be generated based on the Test Clock input, and then output (e.g., via 307) the number of pulses that are to be generated by the PLL.

MUXs 308, 318. In at least one embodiment, each MUX may provide functionality for selectably switching between OCC clock chain control mode (e.g., which utilizes OCC Clock Chain output 310a) and test clock counter control mode (e.g., which utilizes external Test Clock input 301 ).

Test Clock Count Multiplier 312. An example embodiment of a Test Clock Count Multiplier architecture is illustrated and described with respect to FIG. 7. As illustrated in the example embodiment of FIG. 3, the Test Clock Count Multiplier 312 is configured as a (2^MULT)*count Multiplier. In at least one embodiment, for pseudo synchronous clock domains, it may be preferable to use a single or designated OCC engine at the source PLL to generate the high speed PLL test clock signals.

Fast Test Mode (FTM) Pulse Generating Logic 314. As illustrated in the example embodiment of FIG. 3, the input to the FTM Pulse Generating Logic is the test_clock_count 315, which specifies the number of pulse(s) to be generated by the PLL and the PLL clocks. In at least one embodiment, the FTM Pulse Generating Logic may use the specified number of pulse(s) to clip (or restrict) the input PLL clock (e.g., 317) to a number of clock cycles which match the specified number of pulse(s). For example, if the number of pulses specified by test_clock_count 315 were equal to 2, then the FTM Pulse Generating Logic would output 2 pulses (e.g., at 331), which would be represented by (or implemented as) 2 PLL clock cycles.

Twindow Counter 316. In at least one embodiment the Twindow Counter may be configured or designed as a programmable counter which may be programmed (e.g., via JTAG) to count a specified (or predetermined) number of wait cycles for a specified window or time interval (e.g., Twindow). In one embodiment, the Twindow Counter may be implemented as a descending Twindow counter. According to one embodiment, when Scan_en 325 goes low, the Twindow Counter starts counting, and the Test Clock Counter counts pulses that are applied from the ATE (e.g., via Test Clock 301). When the specified Twindow Counter value has been reached, the Twindow Counter sends out a send_fast_pulse signal 327 to the FTM Pulse Generating Logic to thereby cause the FTM Pulse Generating Logic to generate the appropriate number of PLL pulses, which, for example, may be based on the Test Clock Counter pulse count value(s).

It will be appreciated that, in at least some embodiments, when commercial ATPG tools (such as the Synopsys Tetramax, for example) are used in connection with the hybrid on-chip clock controller, the ATPG tool(s) may not able to achieve the same degree of transition coverage in OCC clock chain control mode as compared to test clock pulse control mode. Accordingly, various types of novel hybrid pattern flow(s) may be developed and employed which, in at least some embodiments, may use either or both types of OCC patterns to achieve optimal coverage and pattern count.

For example, referring to the example embodiment of FIG. 3, when it is desirable that an OCC clock chain control mode be used, the Input Selection MUX 308 may be programmed to select the OCC Clock Chain input 305 (e.g., by setting OCC_ENABLE (309)=high). In at least one embodiment, this may be accomplished via the use of JTAG flops. During OCC clock chain control mode, Clock Chain-based OCC may be enabled for generating transition ATPG patterns. In one embodiment, the OCC Clock Chain engine 310 may be supported by one or more commercial ATPG tool(s) which, when enabled, allow the ATPG tool(s) to utilize the OCC Clock Chain engine 310 to control the internal high speed clocks.

Figure 5:
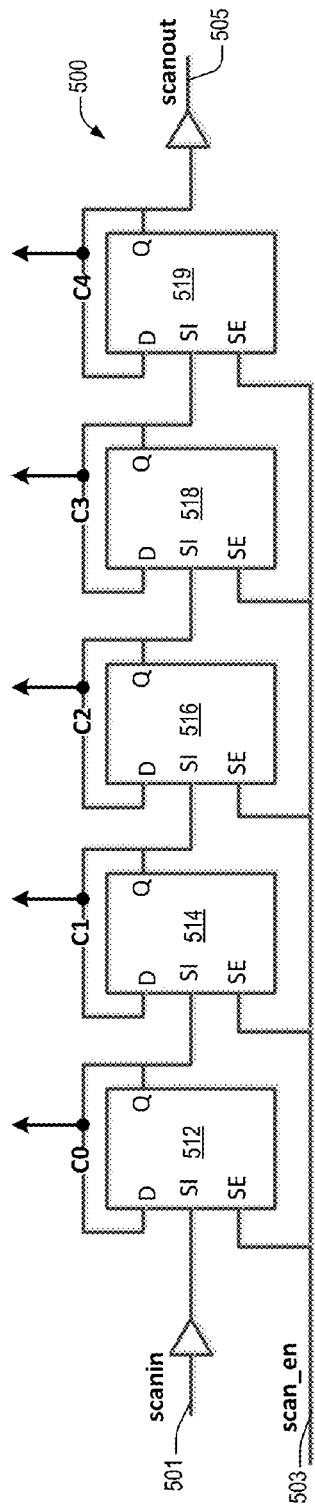
FIG. 5 shows an example embodiment of a 5-bit OCC Clock Chain engine architecture 500.

In one embodiment, clock chains may be comprised of one or more scan flops (e.g., Flip-Flops stitched on a scan chain, as shown in FIG. 5, for example), and each scan flop in the clock chain (e.g., C0, C1, C2, etc.) may be designated to represent one PLL clock pulse in capture mode (e.g., if C0=1 then pulse, if C0=0 then no pulse). As these may be part of the scan chain (e.g., as shown in FIG. 5), ATPG tool(s) may shift in required value(s) per test pattern, thereby dynamically enabling internal clocks. Additionally, the OCC Clock Chain flops may be configured or designed to retain their shift in value(s) during capture. Thus, for example, the clock chain value of 00111 may be interpreted as corresponding to (or representing) 3 high speed internal capture pulses: 00PPP (indicated by internal clock 3 pulses at PLL clock speed). At the end of shift mode, the OCC Clock Chain values may be converted to "pre_test_clock_count" by a decoder such as, for example, the OCC Clock Chain Decoder 304 (FIG. 3).

Referring again to the example embodiment of FIG. 3, when it is desirable that a test clock control mode be used, the Input Selection MUX 308 may be programmed to select the Test Clock input 301 (e.g., by setting OCC_ENABLE=low). In at least one embodiment the test clock control mode may be implemented as a test clock counter-based OCC, which, for example, may be used for scan debug, ISD test, FTM clock debug, and/or other types of IC related tests. In some embodiments, one or more of these types of test may be implemented or performed independent of ATPG tool(s).

In at least one embodiment, when test clock control mode is enabled, and when the "Bypass" bit (e.g., 327) is set to high (e.g., set to 1) during pattern generation, the PLL and FTM engine(s) may be bypassed with the Test Clock. In at least one embodiment, ATPG tool(s) may be configured or designed to use the same Test Clock port for both shift and capture mode, similar to stuck-at testing mode. In some embodiments when the "Bypass" bit is set to low (e.g., set to 0), the Test Clock Counter 306 may count the number of Test Clock pulses on the Test Clock port 301 for a given pattern, and may provide an output value of the Test Clock pulse count (e.g., 307), which may be designated as representing the "pre_test_clock_count" (e.g. 311).

Figure 6:
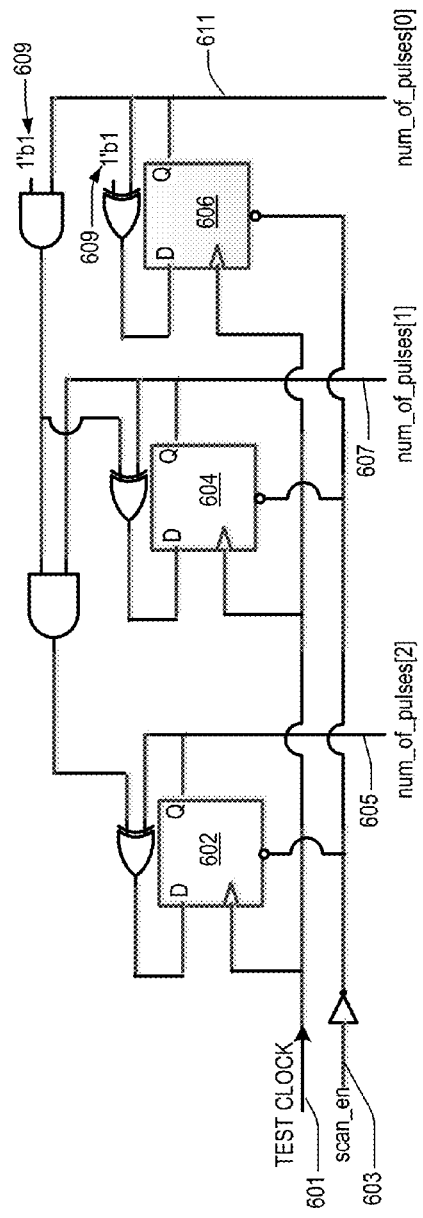
FIG. 6 shows a logic diagram of a Test Clock Counter architecture 600 in accordance with a specific embodiment.

FIG. 6 shows a logic diagram of a Test Clock Counter architecture 600 in accordance with a specific embodiment. In one embodiment, the Test Clock Counter 600 may be configured or designed to count the number of Test Clock pulses during a specified time interval (such as, for example, while scan_en is set to 0 (or set to low)). Additionally, the Test Clock Counter 600 may be configured or designed to provide an output value of the Test Clock pulse count (which, for example, may be referred to as a "num_of_pulses"). In the example embodiment of FIG. 6, the 3-bit output of the Test Clock Counter 600 is represented by num_of_pulses[0] (611), num_of_pulses[1] (607), and num_of_pulses[2] (605). Additionally, in the specific example embodiment of FIG. 6, it may be assumed that the 1'b1 signal(s) (609) are tied to a logical 1 value.

In the specific example embodiment of FIG. 6, Test Clock Counter 600 is implemented as a 3-bit Test Clock Counter which may count up to 7 test clock pulses. However, it will be appreciated that alternate embodiments of Test Clock Counter(s) (not shown) may be configured or designed to include additional or fewer bits, as desired. For example, in at least one embodiment, an n-bit Test Clock Counter may be provided.

FIG. 5 shows an example embodiment of a 5-bit OCC Clock Chain engine architecture 500. As illustrated in the example embodiment of FIG. 5, OCC Clock Chain Engine 500 includes a plurality of scan flops (512, 514, 516, 518, 519. It will be appreciated that alternate embodiments of OCC Clock Chain engine(s) (not shown) may be configured or designed to include additional or fewer scan flops (as desired) as compared to the specific embodiment of FIG. 5. For example, in at least one embodiment, an n-bit OCC Clock Chain engine may be configured or designed to include n scan flops which are stitched together in a configuration similar to that illustrated in FIG. 5.

In at least one embodiment, each scan flop in the clock chain (e.g., C0, Cl, C2, etc.) may be designated to represent one PLL clock pulse in capture mode (e.g., if C0=1 then pulse, if C0=0 then no pulse). In at least some embodiments, ATPG tool(s) (and/or other techniques) may be used to shift in required value(s) (e.g., via scanin input 501) for a given test pattern. Additionally, the OCC Clock Chain flops may be configured or designed to retain their shift in value(s) during capture. In this way, the OCC Clock Chain Engine 500 may be automatically and dynamically programed (e.g., at a given time) to output a specified value (e.g., 00111, where C0=0, C1=0, C2=1, C3=1, C4=1) representing a specified number of PLL clock pulses to be applied during at-speed scan testing. Thus, for example, an OCC Clock Chain value of 00111 may be interpreted as corresponding to (or representing) 3 high speed internal capture pulses: OOPPP (indicated by 3 internal clock pulses (P) at PLL clock speed). In at least one embodiment, the number of clock cycles needed to program the OCC Clock Chain flops may be equal to the total number of flops to be programmed.

At the end of shift mode (e.g., when the OCC Clock Chain output value has been dynamically set as desired), the OCC Clock Chain values may be converted to "pre_test_clock_count" by a decoder such as, for example, an OCC Clock Chain Decoder (e.g., 304, FIG. 3). As described previously, OCC Clock Chain Decoder 304 (FIG. 3) may be configured or designed to count and/or determine the number of pulses associated with the OCC Clock Chain output value. An example embodiment of an OCC Clock Chain Decoder logic is illustrated and described with respect to FIG. 8.

FIG. 8 shows a logic diagram of an OCC Clock Chain Decoder architecture 800 in accordance with a specific embodiment. In at least one embodiment, the OCC Clock Chain Decoder processes decodes the value(s) of the OCC Clock Chain input 810 in order to determine the number of pulses (e.g., 0, 1, 2, 3, . . . , etc.) to be applied to the PLL Clock. As illustrated in the example embodiment of FIG. 8, the output of the OCC Clock Chain Decoder may include a value 805 representing a specified number of pulses to be applied to the PLL Clock during a given time interval.

In the specific example embodiment of FIG. 8, the OCC Clock Chain Decoder 800 is configured or designed to generate a 3-bit pulse count output (e.g., D[0]-D[2]) based upon 5 OCC Clock Chain inputs (e.g., C0-C4). Thus, for example, the 3-bit output of the OCC Clock Chain Decoder 800 may be represented by D[0], D[1], and D[2]. These 3 signals may be used to indicate the number of pulses to be generated by the PLL (e.g., 000—no pulse; 001—1 pulse; 010—2 pulses; 011—3 pulses, etc.). However, it will be appreciated that alternate embodiments of OCC Clock Chain Decoder(s) (not shown) may be configured or designed to handle additional or additional or fewer inputs, and may further be configured or designed to generate output(s) which include additional or fewer bits that that illustrated in the specific example of FIG. 8.

Figure 4:
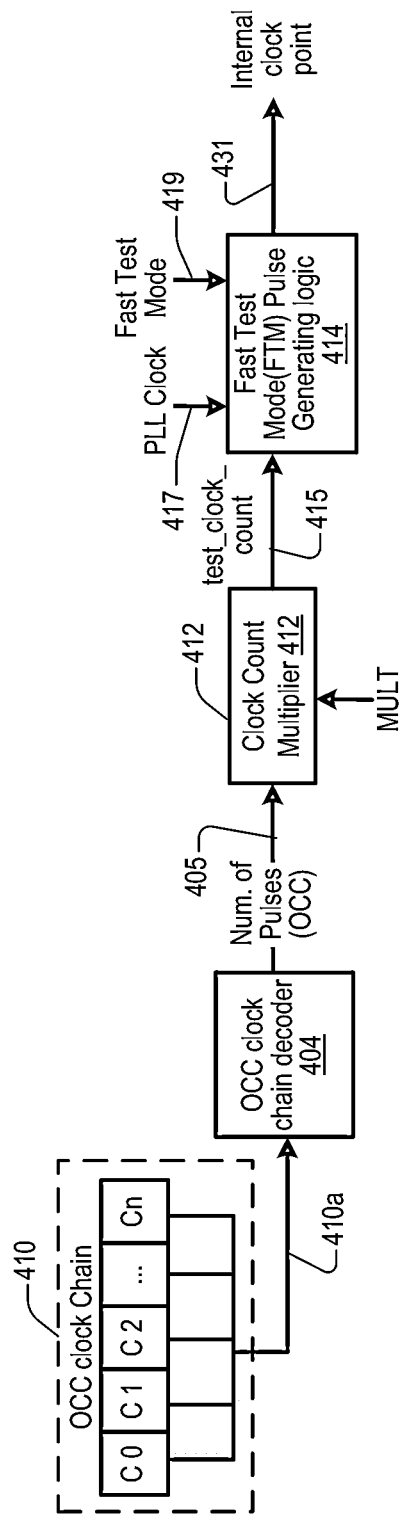
FIG. 4 shows an alternate example embodiment of an on-chip clock controller architecture 400.

FIG. 4 shows an alternate example embodiment of an on-chip clock controller architecture 400. In at least one embodiment, the on-chip clock controller architecture component(s) of FIG. 4 may be operable to perform and/or implement at least some of the various types of functions, operations, actions, and/or other features described with respect to the hybrid on-chip clock controller embodiment of FIG. 3.

FIG. 7 shows an example embodiment of a Test Clock Count Multiplier 700. In at least one embodiment, at least a portion of the functions, features, and/or components of the Test Clock Count Multiplier of FIG. 7 may be used for implementing the Test Clock Multiplier 312 of FIG. 3.

In at least one embodiment, the Test Clock Count Multiplier 700 may be configured or designed to function as a (2^MULT)*count multiplier, where MULT may correspond to an input signal or value. In at least one embodiment, Test Clock Count Multiplier 700 may be configured or designed to function as a simple multiplier for a pseudo synchronous domains having DIV-1 and DIV-2 frequency clocks. Thus, for example, when MULT signal is set to 1, and the Test Clock Count Multiplier 700 input receives (as input) 2 test clock pulses, the OCC may issue 4 PLL pulses which can be used to generate two DIV-1 and two DIV-2 frequency fast pulses.

Wait Cycle Reductions

For pseudo synchronous clock domains (e.g., where one PLL generates multiple internal clocks at different frequencies), it may be preferable to use a single or designated OCC engine at the source PLL to generate high speed PLL pulses for all (or selected) pseudo synchronous clocks. For such domains, the "MULT" signal may be programmed >0, so that the pre_test_clock_count is multiplied by 2MULT, thereby enabling the system to generate a desired number of high speed clock pulses which are suitable for enabling generation of divide by N (DIV-N) frequency clock pulses.

As mentioned previously, when performing at-speed scan test patterns using ATE, a sufficient number of wait cycles should preferably to be added in capture mode (e.g., during Twindow) to ensure that the OCC engine is able to sample the test clock pulses (e.g., during Twindow), and then issue internal fast clock pulses (e.g., during Temit). As a result, when performing at-speed scan test patterns using ATE, the test times required for performing at-speed scan testing of transition patterns may be significantly increased due to the insertion of the additional wait cycles for each test pattern.

For example, with some types of IC chips, the average wait cycle (or padding cycle) per pattern is about 400 cycles, which is corresponds to about 37% extra test time of transition patterns due to the insertion of the additional wait cycles for each test pattern. However, as described in greater detail below, when performing at-speed scan test patterns using the OCC Clock Chain engine, such additional wait cycles may be significantly reduced or eliminated, thereby significantly reducing the test times required for performing at-speed scan testing.

For example, in one embodiment when performing at-speed scan test patterns using ATE, the Twindow Counter (which is clocked by PLL) may be triggered when scan_en goes 0 (or low). The time interval represented by Twindow may be used to help ensure that the "pre_test_clock_count" value (e.g., 311) is settled and final before being read by other system components such as, for example, the Test Clock Count Multiplier 312 and/or FTM Pulse Generating logic 314. According to one embodiment, when scan_en 325 goes low, the Twindow Counter starts counting, and the Test Clock Counter starts counting Test Clock pulses. In one embodiment, the Twindow Counter value is programmed to include an additional number of wait cycles to ensure that the OCC engine is able to sample the test clock pulses (e.g., during Twindow). When the specified Twindow Counter value has been reached, the send_fast_pulse signal 327 may go high, which, in turn, may cause the FTM Pulse Generating Logic to generate (e.g., during the Temit time interval) a specific number of high speed clock pulses equal to the "Test_Clock_Count" value 315.

However, when performing at-speed scan test patterns using the OCC Clock Chain engine, the "test_clock_count" count is ready and settled before scan_en goes low and hence there is no dependency between shift clock and PLL clock. As a result, the Twindow Counter can be programmed to 0 or some minimum threshold value sufficient to allow the value of the scan flops to stabilize. An example of these timings is illustrated in timing diagram of FIG. 2.

FIG. 2 shows an example timing diagram illustrating one embodiment for implementing at-speed scan test patterns using the OCC Clock Chain engine. As illustrated in the example embodiment of FIG. 2, Twindow (Tw) utilizes only a minimum threshold number of wait cycles (e.g., 3 cycles) to allow the value of the scan flops to stabilize. Additionally, only a minimum number of wait cycles (e.g., 3 cycles) may be used in capture mode to account for the Temit window (since, for example, Temit may use a few cycles to generate the fast clock pulses). As a result, as illustrated in the example embodiment of FIG. 2, when performing at-speed scan test patterns using the OCC Clock Chain engine, the capture period (e.g., Tw+Temit) may be significantly reduced or shortened, resulting in the test times needed for performing at-speed scan testing being significantly reduced.

OCC Clock Chain Engine and Compression

Figure 11:
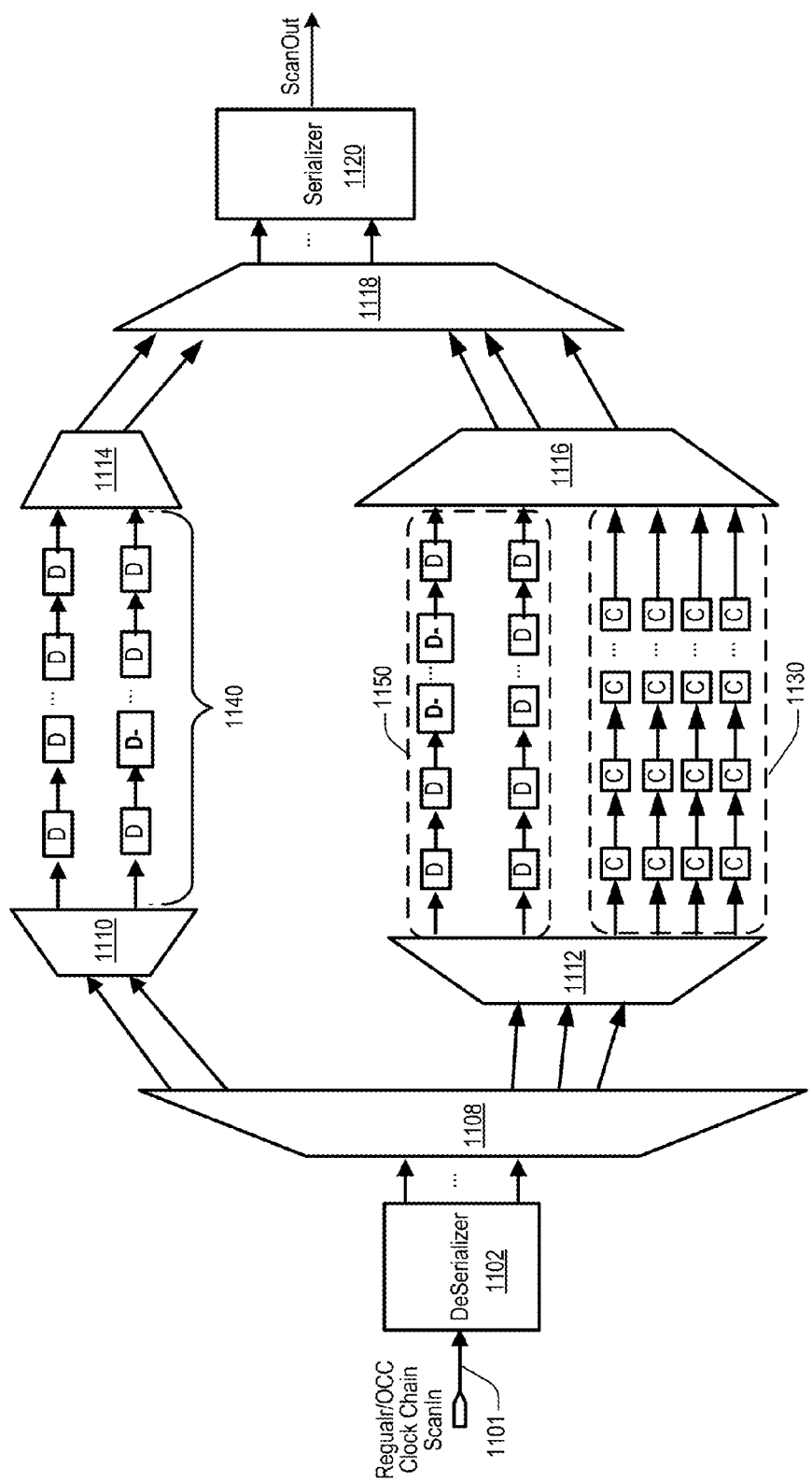

Additionally, according to different embodiments, one or more test compression scheme(s), may be advantageously employed to handle various types of OCC clock chain(s) such as, for example, those with minimum scan channel requirement(s). For example, FIGS. 9-11 illustrate various example embodiments of different types of test compression schemes which may be used for DFT testing.

Figure 9:
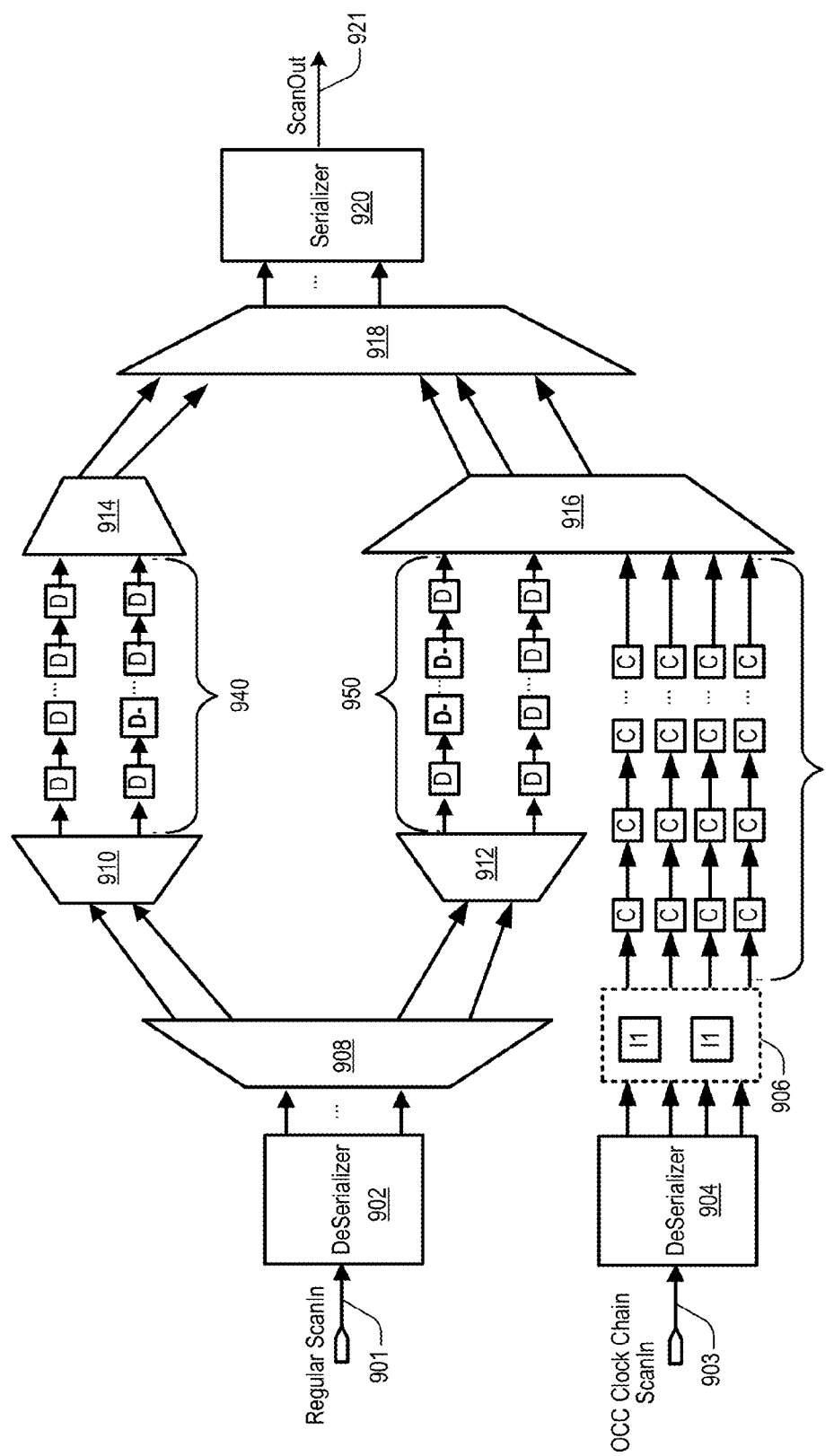

FIG. 9 illustrates an example embodiment of a hybrid test compression scheme 900. In at least one embodiment, the hybrid test compression scheme 900 may utilizes a compression architecture and be configured or designed to include OCC Clock Chain support. For OCC flops, controllability is an important consideration. However, there typically is no observability requirement as the OCC flops retain their shifted in value during capture. Additionally, ATPG tools typically do not rely on OCC flops to observe combinational logic to achieve coverage. In light of these this observations, a test compression scheme such as that illustrated in FIG. 9 may be utilized, wherein non-compressed (or uncompressed) structure is used at the input side (e.g., 901, 903), and wherein compressed architecture is used at the output side (e.g., 921). Advantageously, this scheme can reduce the scan IO requirements for OCC chains while maintaining full or desired levels of controllability.

As illustrated in the example embodiment of FIG. 9, the test compression scheme 900 may include one or more of the following types of component(s) and/or signal(s):

DeSerializers 902, 904. In at least one embodiment, the DeSerializers may be configured or designed to time division demultiplex the serial high speed input IO data to several parallel low speed internal shift data.

Serializer(s) 920. In at least one embodiment, the Serializer(s) may be configured or designed to time division multiplex the parallel low speed internal shift data to generate a serialized output (e.g., ScanOut).

Dummy Decompresser 906. In at least one embodiment, the Dummy Decompresser may be configured or designed not to perform decompression of the input signal(s).

Multiplexors 908, 910, 912. In at least one embodiment, the multiplexors may be configured or designed to function as compressor(s) to multiplex or compress the various input data. According to different embodiments, the decompression circuit(s) may be implemented using code-based logic such as Huffman Code, XOR gates dominated linear decompression logic, multiplexor based broadcast logic, and the like.

Demultiplexors 914, 916, 918. In at least one embodiment, the Demultiplexors may be configured or designed to function as decompressor(s) to demultiplex or decompress the various input data. According to different embodiments, the compression circuit(s) may be implemented using XOR based space compactors, Multiple Input Shift Registers (MISR) based time compactors, and the like.

Regular ScanIn 901. In at least one embodiment, the Regular ScanIn signal(s) may be generated by (or provided by) the ATE and/or other external input sources.

OCC Clock Chain ScanIn 903—In at least one embodiment, the OCC Clock Chain ScanIn signal(s) may be generated by (or provided by) the ATE and/or other external input sources.

Compressed Scan Flop signals (940, 950) may include positive edge flop signals (e.g., identified in FIG. 9 as "D"), and/or may include negative edge flop signals (e.g., identified in FIG. 9 as "D−").

Non-compressed OCC Clock Chain signal streams 930. As illustrated in the example embodiment of FIG. 9, the OCC Clock Chain signals are identified as "C".

The test compression scheme of FIG. 9 may also be seamlessly integrated into test compression architectures which may be used on a variety of commercially available IC chips. For example, in one embodiment, a 200 MHz high speed scan in data signal (e.g., 901) may be time demultiplexed into four internal 50 MHz signal steams using a 4-to-1 DeSerializer (e.g., 902). Additionally, the test compression scheme may support multiple (e.g., 4) OCC Clock Chain ScanIn signals. The outputs of OCC Clock Chain signal streams (930) may be merged with regular test compression chains (e.g., 940, 950) via one or more compressors. Since there may be hundreds of test compression chains under the same compressor, adding a few OCC chains do not significantly change the IO requirements for the compressor(s). Additionally, in at least one embodiment, the OCC chains never have unknown values, and therefore do not compromise the compression quality.

In some embodiments, the ATPG tool(s) may be configured or designed to achieve improved coverage in test clock pulse control mode. For example, to help mitigate some the inefficacies attributable to the use of the ATPG tool(s), a full size clock chain control mode pattern set may be used to achieve the first 95% (or n %) of expected transition coverage, and a smaller set of test clock pulse control mode top up pattern(s) may be added to achieve the remaining 5% (or m %, where n+m=100) of the expected transition coverage. With this combined ATE pattern flow which incorporates use of hybrid OCC Clock Chain Engines on the silicon, it is possible to achieve improved and/or optimal coverage and test time trade-off. Moreover, usage of this hybrid OCC test compression scheme helps to reduce the bring-up time and test time/cost for ATPG patterns, with minimal hardware changes and with reduced area and timing impact.

By way of example, the hybrid on-chip clock controller architecture of FIG. 3 and test compression scheme of FIG. 9 were internally implemented and tested on NVidia™ GM10x chips. The test results revealed that the tested configuration facilitated a significant reduction in transition ATPG pattern bring up time. For example, empirical data revealed that transition ATPG pattern bring up times of IC chips which incorporated the hybrid OCC scheme(s) described herein took only a few days, whereas transition ATPG pattern bring up times of conventional IC chips (e.g., which did not incorporate the hybrid OCC schemes described herein) typically took about 1-2 months. Additionally, empirical data also revealed that transition test times of IC chips which incorporated the hybrid OCC scheme(s) described herein were reduced by about 40% as compared to transition test times of conventional IC chips (e.g., which did not incorporate the hybrid OCC schemes described herein).

FIGS. 10A and 10B illustrate an alternate example test compression scheme in which compression is utilized for regular (e.g., ATE) ScanIn (e.g., FIG. 10A), and in which non-compression utilized for the OCC Clock Chain flops (e.g., FIG. 10B). For example, as illustrated in the example embodiment of FIG. 10B, the OCC flops are implemented on completely non-compressed scan chains (e.g., 1030). This scheme provides full controllability on the OCC flops, but may require dedicated scan pins and ATE channels. For very large and complex SOC (System on Chip) designs, the clock domain and OCC chain segments may be significantly numerous. When there are physical routing/chain length reasons preventing these OCC chains to be stitched in a daisy chain fashion, the dedicated OCC scan IO requirements may make the test compression architecture inefficient.

Another other option to handle OCC chain is to treat them the same as regular scan flops and put them in the test compressed chains. An example of this type of test compression scheme is illustrated in FIG. 11. The test compression scheme of FIG. 11 eliminates the dedicated scan IO requirement for OCC chains (e.g., as illustrated in FIG. 10B), but may introduce controllability issues. For example, as illustrated in the example embodiment of FIG. 11, signals from the OCC flops are included in the compressed chain (e.g., 1130), they share ScanIn IO with other compressed chains and hence there might be conflicts between the values on OCC flops (e.g., to control the clock) and the values on other normal scan flops (e.g., to get specific coverage). Because of this natural behavior of test compression, ATPG tool(s) may be configured or designed to generate more patterns to resolve these conflicts, thereby resulting in larger pattern set and more test time.

Other aspects relating to at-speed scan testing technology are disclosed in commonly assigned, U.S. Pat. No. 7,305,598, by Sanghani et al., titled "TEST CLOCK GENERATION FOR HIGHER-SPEED TESTING OF A SEMICONDUCTOR DEVICE", filed Mar. 25, 2005, the entirety of which is incorporated herein by reference for all purposes.

Although several example embodiments of one or more aspects and/or features have been described in detail herein with reference to the accompanying drawings, it is to be understood that aspects and/or features are not limited to these precise embodiments, and that various changes and modifications may be effected therein by one skilled in the art without departing from the scope of spirit of the invention(s) as defined, for example, in the appended claims.

It is claimed:

1. A method, comprising:
receiving, at a semiconductor device to be tested, an external test clock signal, wherein the external test clock signal includes a first set of external test clock pulses;
determining, using the external test clock signal, a first pulse count value representing the first set of external test clock pulses;
causing the semiconductor device to generate a first set of higher frequency test clock signals for a first configurable number of clock cycles during a first capture period, wherein the first configurable number of clock cycles corresponds to the first pulse count value;
generating at the semiconductor device an on-chip clock (OCC) Clock Chain signal, the OCC Clock Chain signal including a first set of OCC Clock Chain data represented by a first set of bits;
determining, using the OCC Clock Chain signal, an OCC pulse count value representing a specific number of higher frequency test clock signal(s) to be generated at the semiconductor device during a second capture period; and
causing the semiconductor device to generate a second set of higher frequency test clock signals for a second configurable number of clock cycles during the second capture period, wherein the second configurable number of clock cycles corresponds to the OCC pulse count value.

2. The method of claim 1:
wherein the first pulse count value corresponds to a first number of higher frequency test clock periods to be generated at the semiconductor device during the first capture period; and
wherein the OCC pulse count value corresponds to a second number of higher frequency test clock periods to be generated at the semiconductor device during the second capture period.

3. The method of claim 1:
wherein the OCC Clock Chain data is representative of a second number of higher frequency test clock periods to be generated at the semiconductor device during the second capture period.

4. The method of claim 1 further comprising:
generating a first count value that represents a first period of time during which a first number of periods of the external test clock signal are counted to determine a number of higher frequency test clock periods to be generated during the first capture period.

5. The method of claim 1 further comprising:
causing the semiconductor device to automatically and dynamically switch to a test clock pulse control mode of operation during a first time interval; and
causing the semiconductor device to automatically and dynamically switch to an OCC clock chain control mode of operation during a second time interval.

6. The method of claim 1 further comprising:
causing the semiconductor device to automatically and dynamically switch to a test clock pulse control mode of operation during a first time interval;
wherein, during the test clock pulse control mode of operation, a first plurality of operations are performed, including: the receiving of the external test clock signal, the determining of the first pulse count value; and the generating of the first set of higher frequency test clock signals;
causing the semiconductor device to automatically and dynamically switch to an OCC clock chain control mode of operation during a second time interval;
wherein, during the OCC clock chain control mode of operation, a second plurality of operations are performed including: the generating of the OCC Clock Chain signal, the determining of the OCC pulse count value; and the generating of the second set of higher frequency test clock signals.

7. The method of claim 1 further comprising:
programming, using a first ScanIn signal, a first set of scan flops located at the semiconductor device;
programming, using an OCC Clock Chain ScanIn signal, a second set of scan flops used to generate the OCC Clock Chain signal; and
wherein the first ScanIn signal is different from the OCC Clock Chain ScanIn signal.

8. The method of claim 1 further comprising:
concurrently receiving, at the semiconductor device, a first plurality of OCC Clock Chain ScanIn signals; and
generating, at the semiconductor device and using the first plurality of OCC Clock Chain ScanIn signals, an OCC Clock Chain signal stream which includes the OCC Clock Chain signal.

9. A semiconductor device, comprising:
a clock generator;
an external test clock input configured or designed to receive an external test clock signal, wherein the external test clock signal includes a first set of external test clock pulses;
an external test clock counter coupled to the external test clock input, the external test clock counter being configured or designed to determine, using the external test clock signal, a first pulse count value representing the first set of external test clock pulses;
an on-chip clock (OCC) Clock Chain engine configured or designed to generate an OCC Clock Chain signal, the OCC Clock Chain signal including a first set of OCC Clock Chain data represented by a first set of bits;
an OCC Clock Chain decoder configured or designed to determine, using the OCC Clock Chain signal, an OCC pulse count value representing a specific number of higher frequency test clock signal(s) to be generated at the semiconductor device during a second capture period;
a fast test mode pulse generating logic coupled to the clock generator, the fast test mode pulse generating logic being configured or designed to cause the clock generator to generate a first set of higher frequency test clock signals for a first configurable number of clock cycles during a first capture period, wherein the first configurable number of clock cycles corresponds to the first pulse count value; and wherein the fast test mode pulse generating logic is further configured or designed to cause the clock generator to generate a second set of higher frequency test clock signals for a second configurable number of clock cycles during the second capture period, wherein the second configurable number of clock cycles corresponds to the OCC pulse count value.

10. The semiconductor device of claim 9:

wherein the first pulse count value corresponds to a first number of higher frequency test clock periods to be generated at the semiconductor device during the first capture period; and wherein the OCC pulse count value corresponds to a second number of higher frequency test clock periods to be generated at the semiconductor device during the second capture period.

11. The semiconductor device of claim 9:

wherein the OCC Clock Chain data is representative of a second number of higher frequency test clock periods to be generated at the semiconductor device during the second capture period.

12. The semiconductor device of claim 9 further comprising:

a Twindow Counter configured or designed to generate a first count value that represents a first period of time during which a first number of periods of the external test clock signal are counted to determine a number of higher frequency test clock periods to be generated during the first capture period.

13. The semiconductor device of claim 9 further comprising:

a switch or MUX configured to receive a first signal for causing the semiconductor device to automatically and dynamically switch to a test clock pulse control mode of operation during a first time interval; and wherein the switch or MUX is further configured or designed to receive a second signal for causing the semiconductor device to automatically and dynamically switch to an OCC clock chain control mode of operation during a second time interval.

14. The semiconductor device of claim 9 further comprising:

a switch or MUX configured to receive a first signal for causing the semiconductor device to automatically and dynamically switch to a test clock pulse control mode of operation during a first time interval;

wherein, during the test clock pulse control mode of operation, the semiconductor device is configured or designed to perform a first plurality of operations including: the receiving of the external test clock signal, the determining of the first pulse count value; and the generating of the first set of higher frequency test clock signals;

wherein the switch or MUX is further configured or designed to receive a second signal for causing the semiconductor device to automatically and dynamically switch to an OCC clock chain control mode of operation during a second time interval; and wherein, during the test clock pulse control mode of operation, the semiconductor device is configured or designed to perform a second plurality of operations including: the generating of the OCC Clock Chain signal, the determining of the OCC pulse count value; and the generating of the second set of higher frequency test clock signals.

15. The semiconductor device of claim 9 further comprising a first ScanIn input for receiving a first ScanIn signal and a first OCC Clock Chain ScanIn input for receiving an OCC Clock Chain ScanIn signal, wherein the first ScanIn signal is different from the OCC Clock Chain ScanIn signal, the semiconductor device being further operable to:

program, using the first ScanIn signal, a first set of scan flops located at the semiconductor device; and program, using the OCC Clock Chain ScanIn signal, a second set of scan flops associated with the OCC Clock Chain engine which are used to generate the OCC Clock Chain signal.

16. The semiconductor device of claim 9 being further operable to:

concurrently receive, at the semiconductor device, a first plurality of OCC Clock Chain ScanIn signals; and generate, at the semiconductor device and using the first plurality of OCC Clock Chain ScanIn signals, an OCC Clock Chain signal stream which includes the OCC Clock Chain signal.

17. A semiconductor device, comprising:

means for causing an apparatus to dynamically switch to a test clock pulse control mode of operation during a first time interval;

means for causing the apparatus to perform a first plurality of operations during the test clock pulse control mode of operation, the first plurality of operations including:

(i) receiving a test clock signal which includes a first set of test clock pulses;

(ii) determining, using the test clock signal, a first pulse count value representing the first set of test clock pulses;

(iii) generating a first set of higher frequency test clock signals for a first configurable number of clock cycles during a first capture period, wherein the first configurable number of clock cycles corresponds to the first pulse count value;

means for causing the apparatus to automatically and dynamically switch to an on-chip clock (OCC) clock chain control mode of operation during a second time interval; and means for performing a second plurality of operations at the apparatus during the OCC clock chain control mode of operation, the second plurality of operations including:

(i) generating an OCC Clock Chain signal, the OCC Clock Chain signal including a first set of OCC Clock Chain data represented by a first set of bits;

(ii) determining, using the OCC Clock Chain signal, an OCC pulse count value representing a specific number of higher frequency test clock signal(s) to be generated at the apparatus during a second capture period;

(iii) generating a second set of higher frequency test clock signals for a second configurable number of clock cycles during the second capture period, wherein the second configurable number of clock cycles corresponds to the OCC pulse count value.

18. The semiconductor device of claim 17 further comprising:

means for programming, using a first ScanIn signal, a first set of scan flops located at the semiconductor device; and means for programming, using an OCC Clock Chain ScanIn signal, a second set of scan flops used to generate the OCC Clock Chain signal.

19. The semiconductor device of claim 17 further comprising:
means for concurrently receiving, at the semiconductor device, a first plurality of OCC Clock Chain ScanIn signals; and
means for generating, at the semiconductor device and using the first plurality of OCC Clock Chain ScanIn signals, an OCC Clock Chain signal stream which includes the OCC Clock Chain signal.

20. The semiconductor device of claim 17 further comprising:
means for receiving the test clock signal;
means for determining, using the test clock signal, a first pulse count value representing the first set of test clock pulses;
means for generating the first set of higher frequency test clock signals for the first configurable number of clock cycles during the first capture period;
means for generating the OCC Clock Chain signal;
means for determining, using the OCC Clock Chain signal, the OCC pulse count value; and
means for generating the second set of higher frequency test clock signals for the second configurable number of clock cycles during the second capture period.

* * * * *